United States Patent [19]

Tsubokura et al.

[11] Patent Number: 4,675,718
[45] Date of Patent: Jun. 23, 1987

[54] DIODE-CONTAINING CONNECTOR

[75] Inventors: Shizuo Tsubokura; Hiroyuki Okamoto; Itsuo Takayanagi, all of Shizuoka, Japan

[73] Assignee: Yazaki Corporation, Tokyo, Japan

[21] Appl. No.: 871,919

[22] Filed: Jun. 9, 1986

[30] Foreign Application Priority Data

Jun. 17, 1985 [JP] Japan .................. 60-090039[U]

[51] Int. Cl.⁴ .................................. H01L 23/28
[52] U.S. Cl. ............................. 357/72; 357/81; 357/70; 165/80.2
[58] Field of Search ............ 357/72, 81, 70, 75; 165/80.2; 174/52

[56] References Cited

U.S. PATENT DOCUMENTS 3,142,000 7/1964 Bernstein .................... 357/75
3,783,347 1/1974 Vladik ........................ 357/75
4,450,461 5/1984 Cook et al. .................. 357/75

FOREIGN PATENT DOCUMENTS 59-54250 3/1984 Japan ........................ 357/81

Primary Examiner—Andrew J. James
Assistant Examiner—Mark Prenty
Attorney, Agent, or Firm—Murray and Whisenhunt

[57] ABSTRACT

A diode-containing connector which is improved in its overcurrent resistant characteristics with its increased heat capacity and its improved heat radiating property around a diode therein. The connector comprises terminals mounted in a juxtaposed relationship and one of them is attached with a diode element securely fixed to a base end thereof. A connecting plate electrically interconnects the diode element and a base end of the other terminals. The base end of the diode-attached terminal is bent to form a folded section having an increased thickness while the connecting plate has a thickness equal to or greater than 1.0 mm in order to ensure sufficient heat capacity and heat radiation from the connector.

5 Claims, 5 Drawing Figures

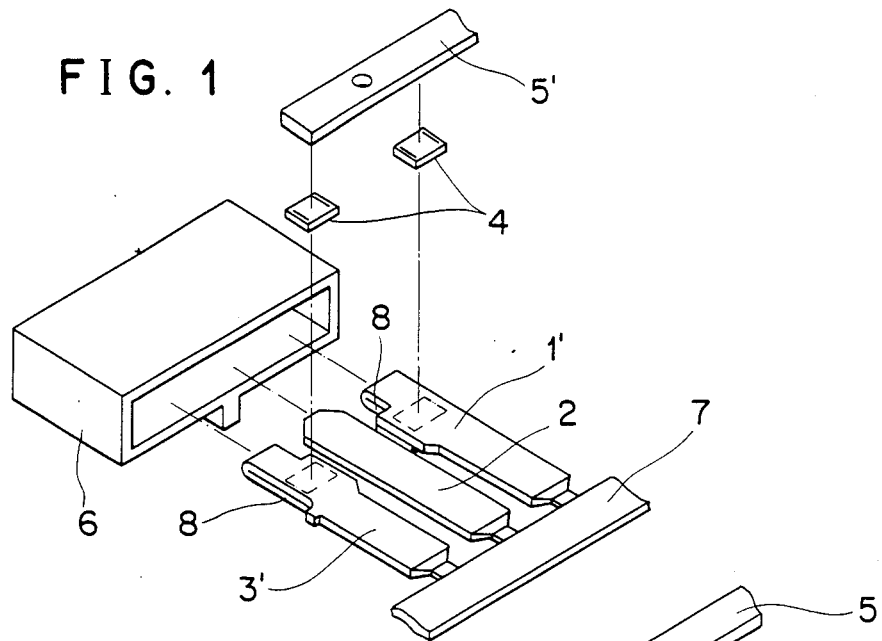
FIG. 1
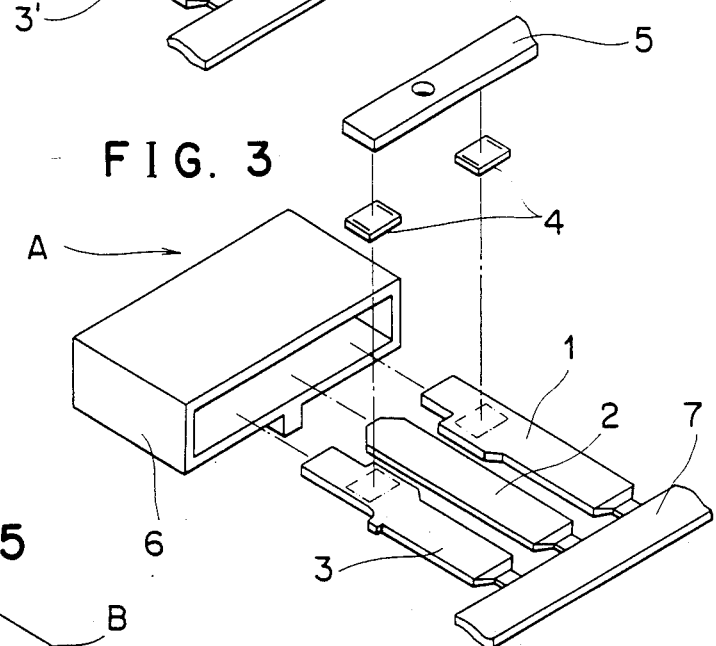
FIG. 3
FIG. 5
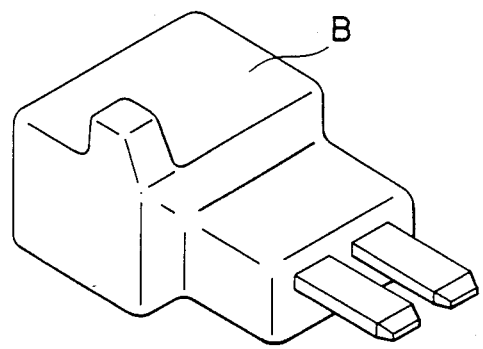

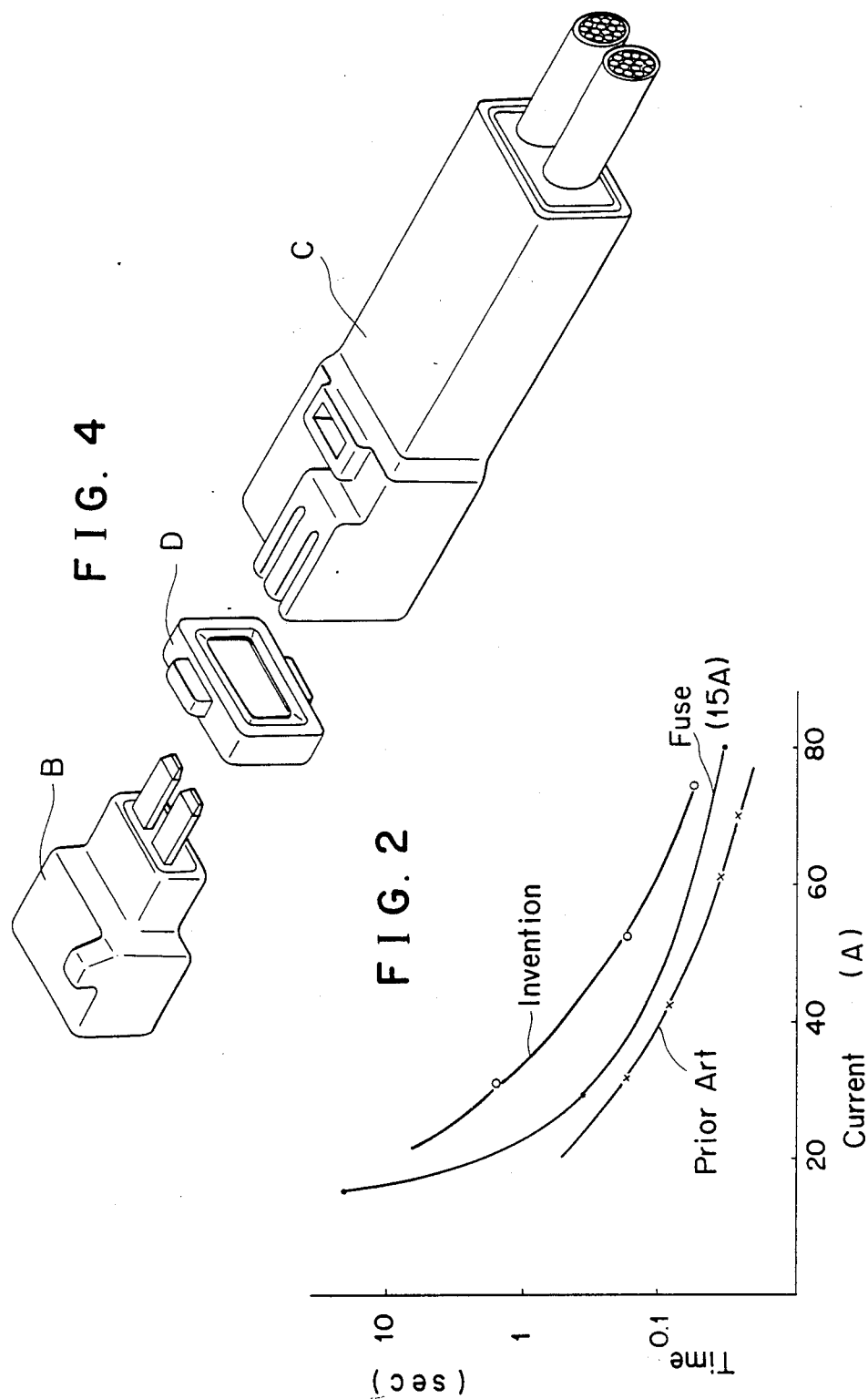

DIODE-CONTAINING CONNECTOR

BACKGROUND OF THE INVENTION

This invention relates to an improvement to a diode-containing connector which is improved in overcurrent resistant characteristics thereof.

Conventionally, a diode-containing connector which is used, for example, for connection of a wire harness or the like, commonly includes a common terminal plate and one or more branch terminal plates, a diode element securely fixed to a base end portion of each of the branch terminal plates, and a connecting plate for electrically interconnecting the common and branch terminal plates. Connecting portions of the connecting plate to the terminal plates are contained in and molded in an integral relationship within a casing with a suitable resin material such as an epoxy resin material.

In the case of the connector as described above, heat from heat generating areas of the diode elements upon energization is radiated mainly from the terminal plates and the connecting plate which have a relatively high heat conductivity. However, since the connecting plate which is coupled to the diode elements has a thickness of as thin as 0.2 mm or so, the heat capacity is low. Accordingly, the temperature rise is great relative to the duration of energization thereto. In this structure, the temperature difference $\Delta T$ of the diode elements from the terminal plates and the connecting plate is negligibly small.

Meanwhile, a wire harness has a fuse for protection of a circuit thereof (normally 15 A or less) which will fuse in a short period of time if an overcurrent flows therethrough due to a short circuiting.

However, since the heat capacity of conventional connectors is low, the temperature of diode elements will rise high in a short period of time before fusing of the fuse. Accordingly, damage to functions of the connectors will occur very often.

SUMMARY OF THE INVENTION

It is an object of the present invention to provide a connector containing a diode which resolves the problems as described above and is improved in its overcurrent resistant characteristics with its increased heat capacity and its improved heat radiating property around the diode.

According to the present invention, there is provided a diode-containing connector comprising first and second terminals, means for holding said first and second terminals in a predetermined positional relationship, a diode element securely fixed to a base end of said second terminal, and a connecting plate electrically interconnecting said diode element and a base end of the first terminal, said holding means including an insulating material molded around connecting portions of said connecting plate to said diode element and said first terminal, said base end of said second terminal being bent over itself to form a folded section, said connecting plate having a thickness of at least 1.0 mm.

By providing the base end of the terminal to which the diode element is securely fixed in the form of a folded structure and by using a connecting plate having a thickness of at least 1.0 mm (five times or more to the thickness of conventional connecting plates) as mentioned above, the heat capacity around heat generating areas of a diode element is increased while the resistance to heat flows is reduced. In addition, the heat radiating property is improved, and hence the temperature rise at a heat generating area of a diode element is prevented. As a result, the overcurrent resistant property is improved so significantly, that functions thereof will not be damaged before a fuse therein is fused.

BRIEF DESCRIPTION OF THE DRAWINGS

FIG. 1 is an exploded perspective view of a first embodiment of the present invention;

FIG. 2 is a graph showing destruction characteristic curves of a connector according to the invention and a conventional connector;

FIG. 3 is an exploded perspective view of the conventional connector;

FIG. 4 is an exploded perspective view of a second embodiment of the invention; and FIG. 5 is a perspective view of a male connector member according to the second embodiment of the invention.

DESCRIPTION OF THE PREFERRED EMBODIMENTS

At first, a typical one of conventional diode-containing connectors is described with reference to FIG. 3. A connector generally denoted at A is shown as triple-pole connector which includes three terminal plates 1, 2 and 3. In the production of the connector, a diode element 4 is securely fixed to a base end portion of the terminal plates 1 to 3, and a connecting plate 5 is provided in such a manner as to electrically interconnect the terminal plates 1 to 3. Then, the terminal plates 1 to 3 are inserted into a casing 6 until connecting portions of the connecting plate 5 to the three terminals 1 to 3 are contained in the casing 6, and the connecting portions are then molded in an integral relationship within the case 6 with a suitable resin material such as an epoxy resin material. The terminal plates 1 to 3 which are originally formed from a single plate material are then cut off into independent terminals from a connecting section of the original plate such as a connecting band denoted at 7. Thus, the terminal plates 1 and 3 each serve as a branch terminal while the terminal plate 2 serves as a common terminal.

Referring now to FIG. 1 which illustrates a connector according to a first embodiment of the present invention, a pair of branch terminals 1' and 3' are provided in a juxtaposed relationship on opposite sides of a common terminal 2, in which each branch terminal has a base end bent below itself to form an folded section 8. Meanwhile, a connecting plate 5' used has a thickness of 1.0 mm or more. Construction of the remaining part of the connector is similar to that of the conventional connector as described above with reference to FIG. 3, and hence description thereof is omitted herein.

While the connecting plate 5 of the conventional connector as shown in FIG. 3 is formed from a brass plate having a thickness of 0.2 mm, expected effects can be attained by using a brass plate of the same material for the connecting plate 5 if folded sections 8 are formed on the branch terminals 1' and 3' while the connecting plate 5' is made to have a thickness of 1.0 mm or more as in the present invention. However, if a copper alloy of the Cu-Fe-P family having a high heat conductivity is used as a material for the terminals, the temperature controlling effect can be further improved.

It is to be mentioned that the number of branch terminals can be increased or decreased as required, and the folded sections 8 may be constructed in three or more layers.

FIG. 2 illustrates results of comparison of overcurrent resistant characteristics of a diode-containing connector according to the present invention with those of a conventional diode-containing connector and also with flow characteristics of a fuse (15 A). The diode-containing connectors have following structural and dimensional features:

Terminal; Brass Plate
  ($0.64 \text{ mm}^t \times 2.3 \text{ mm}^W \times 17.0 \text{ mm}^L$)
Number of Terminals; 3 Poles,
  Distance between Terminal 4.0 mm
Connecting Plate;
  (Connector according to the Present Invention)
  Brass Plate
  ($1.0 \text{ mm}^t \times 2.5 \text{ mm}^W \times 9.0 \text{ mm}^L$)
  (Conventional connector)
  Brass Plate
  ($0.2 \text{ mm}^t \times 2.5 \text{ mm}^W \times 9.0 \text{ mm}^L$)

As can be apparently seen from FIG. 2, the diode element in the connector according to the present invention will not be damaged because the fuse will be fused before the such damage occurs. On the contrary, in the case of the diode element in the conventional connector, it will be damaged before the fuse is fused.

Besides, in the case of a connector wherein the thickness of the connecting plate is less than 1 mm, the diode will be damaged before fusing of the fuse, which can be seen from the fact that the overcurrent characteristic curve of the conventional connector is indicated below the fusing characteristic curve of the fuse.

FIG. 4 illustrates a connector according to a second embodiment of the invention. Here, the connector is constructed as a double-pole connector of the waterproof type which includes a male member B, a female member C and a packing D located between the male and female members for preventing water from entering between the male and female members. The male member may have a similar construction to that of the first embodiment but the male member includes only two terminal plates. Further, a diode though not shown, is contained in and integrally molded with an epoxy resin material. Naturally, the connector can be constructed as a triple-pole connector as in the first embodiment.

FIG. 5 illustrates a male member B in the embodiment of FIG. 4. The male member B is prepared by integrally molding the diode of the terminal with said epoxy resin material without using a housing 6 as in the first embodiment.

The diode containing connector according to the present invention has an excellent overcurrent resistant characteristic which contibutes to the prevention of damage to the diode before the fuse blows.

What is claimed is:

1. A diode-containing connector comprising first and second terminals, means for holding said first and second terminals in a predetermined positional relationship, a diode element disposed on a base end of said second terminal, and a connecting plate electrically interconnecting said diode element and a base end of the first terminal, said holding means including an insulating material molded around connecting portions of said connecting plate to said diode element and said first terminal, said base end of said second terminal being bent over itself to form a folded section, said connecting plate having a thickness of at least 1.0 mm.

2. A diode-containing connector according to claim 1, wherein said holding means further includes a casing to receive said connecting portions of said connecting plate and said insulating material.

3. A diode-containing connector according to claim 1, wherein said first and second terminals are parallelly arranged.

4. A diode-containing connector according to claim 3, further including a third terminal in parallel to said first and second terminals, said third terminal having a base end securely fixed with a diode element, said connecting plate being connected to the diode element of the third terminal.

5. A diode-containing connector according to claim 4, wherein said first terminal is positioned between the second and the third terminals.

* * * * *